(12) United States Patent
An et al.

(10) Patent No.: US 7,864,613 B2
(45) Date of Patent: Jan. 4, 2011

(54) THERMAL CODE TRANSMISSION CIRCUIT AND SEMICONDUCTOR MEMORY DEVICE USING THE SAME

(75) Inventors: Sun Mo An, Icheon-si (KR); Youk Hee Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 222 days.

(21) Appl. No.: 12/156,836

(22) Filed: Jun. 5, 2008

(65) Prior Publication Data

US 2009/0168589 A1 Jul. 2, 2009

(30) Foreign Application Priority Data

Dec. 28, 2007 (KR) .................. 10-2007-0141035

(51) Int. Cl.
*G11C 13/00* (2006.01)
*G11C 1/12* (2006.01)

(52) U.S. Cl. ...................... 365/211; 365/244
(58) Field of Classification Search ............ None
See application file for complete search history.

(56) References Cited

U.S. PATENT DOCUMENTS 7,443,754 B2 * 10/2008 Sako ..................... 365/212

2008/0106451 A1 5/2008 Jeong et al.

FOREIGN PATENT DOCUMENTS

| KR | 10-2005-0033123 A | 4/2005 |
|----|---|---|
| KR | 10-2005-0041600 A | 5/2005 |
| KR | 10-2005-0063880 A | 6/2005 |
| KR | 10-2006-0107919 | * 11/2006 |
| KR | 10-2007-0117735 | 12/2007 |

* cited by examiner

*Primary Examiner*—Hoai V Ho
*Assistant Examiner*—James G Norman
(74) *Attorney, Agent, or Firm*—John P. White; Cooper & Dunham LLP (57) ABSTRACT

Disclosed are a thermal code transmission circuit and a semiconductor memory device using the same. The thermal code transmission circuit includes a select signal generator which generates a select signal in response to a first enable signal, a level signal generator which receives the first enable signal to generate a level signal, an update signal generator which receives the level signal and a first update signal to generate a second update signal, a latch unit which receives a thermal code in response to the second update signal and outputs the thermal code as an output thermal code, and a thermal code output unit which selectively outputs the output thermal code in response to the select signal.

23 Claims, 7 Drawing Sheets

THERMAL CODE TRANSMISSION CIRCUIT AND SEMICONDUCTOR MEMORY DEVICE USING THE SAME

TECHNICAL FIELD

The present disclosure relates to a semiconductor memory device, and more particularly to a thermal code transmission circuit capable of outputting a thermal code generated from a thermal sensor through a TQ pad placed in an input pad unit, thereby reducing the size of a chip and an output driver.

BACKGROUND

Generally, a volatile semiconductor memory device such as a DRAM has been developed to a high-speed and high-integrated memory in order to mate with the high performance of an electronic system such as a personal computer or an electronic communication apparatus. In addition, since a low power consumption characteristic is important in the case of a mobile DRAM used for a cellular phone or a notebook computer, research and development have been actively performed to reduce operational current and stand-by current.

The data retention characteristic of a DRAM memory cell including a transistor and a storage capacitor is very sensitive to the temperature. Accordingly, the semiconductor memory device is adaptively controlled according to temperature characteristics, thereby greatly reducing power consumption. For example, there has been proposed a method of adjusting a refresh period based on temperature information detected by a thermal sensor installed in the semiconductor memory.

Figure 1:
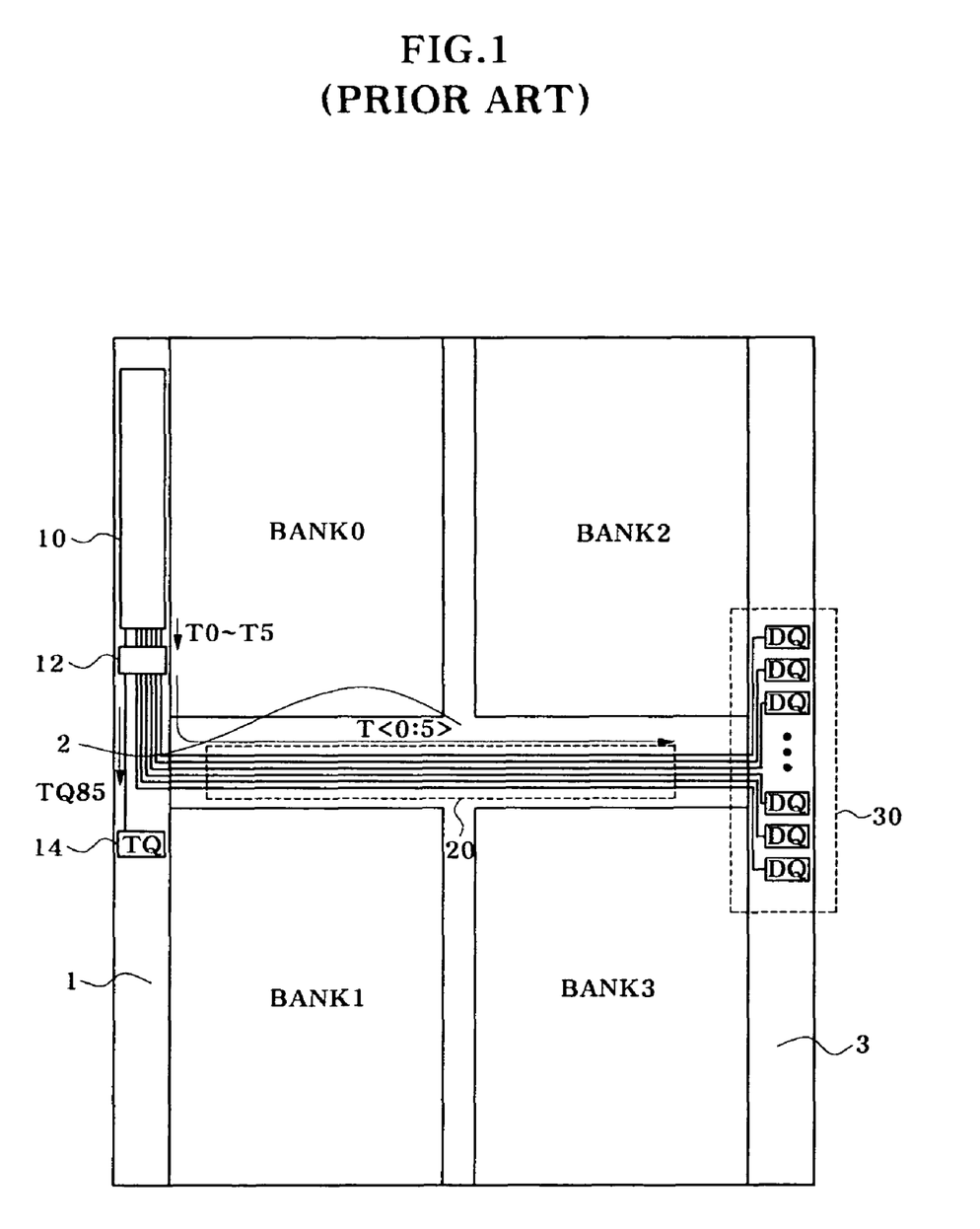
FIG. 1 is a view showing the structure of a mobile DRAM including a conventional thermal sensor.

FIG. 1 is a view showing the structure of a typical mobile DRAM.

As shown in FIG. 1, the typical mobile DRAM includes an input pad unit 1 equipped with a thermal sensor 10, a thermal code transmission circuit 12, and a TQ pad 14, a peri-area 2 formed with a global metal line 20, and a data pad unit 3 formed with a plurality of DQ pads 30.

The thermal sensor 10 generates thermal codes T0 to T5 including internal thermal information of the mobile DRAM and a high-temperature determination signal TQ85 enabled when the internal temperature of the mobile DRAM is 85☐ or more. The high-temperature determination signal TQ85 is output through the TQ pad 14. The thermal code transmission circuit 12 receives the thermal codes T0 to T5 to generate output thermal codes T<0:5>, and the output thermal codes T<0:5> are output through a plurality of DQ pads 30 using the global metal line 20.

Generally, the thermal sensor is mounted on the input pad unit 1 having a spatial margin in the mobile DRAM. Accordingly, in order to output the thermal codes T0 to T5 generated from the thermal sensor 10 to the DQ pad 30, the output thermal codes T<0:5> must be delivered to the DQ pad 30 through the global metal line 20 formed in the peri-area 2. Since the global metal line 20 occupying an area of 8×8000 µm is typically required to transmit 6-bit output thermal codes T<0:5>, the global metal line 20 exerts a serious influence on the size of the mobile DRAM chip. In addition, since the output thermal codes T<0:5> must be delivered by using the global metal line 20 passing through the peri-area 2, the output driver must be enlarged.

SUMMARY

In an aspect of the present disclosure, a thermal code transmission circuit and a semiconductor memory device using the same are provided that are capable of outputting thermal codes generated from a thermal sensor through a TQ pad placed in an input pad unit, thereby reducing the size of a chip and an output driver.

In an embodiment, a thermal code transmission circuit includes a select signal generator which generates a select signal in response to a first enable signal, a level signal generator which receives the first enable signal and generates a level signal, an update signal generator which receives the level signal and a first update signal and generates a second update signal, a latch unit which receives a thermal code in response to the second update signal and outputs the thermal code as an output thermal code, and a thermal code output unit which selectively outputs the output thermal code in response to the select signal.

The first enable signal is a pulse signal used to output the output thermal code.

The select signal generator can include a counter unit which receives the first enable signal and performs a counting operation to generate a counter signal, and a decoder which decodes the counter signal to generate the select signal.

The level signal generator can include a pull-down device which pull-down drives a predetermined node in response to the first enable signal, a pull-up device which pull-up drives the node in response to a reset signal, and a latch which latches a signal of the node.

The pull-down device can be an NMOS transistor, and the pull-up device can be a PMOS transistor.

The update signal generator can include a logic device which receives the first update signal and the level signal and performs a logical operation with respect to the first update signal and the level signal.

The logic device can generate the second update signal which is disabled in response to enable of the level signal.

The latch unit can include a transmission device which transmits the thermal code in response to the second update signal, and a latch which latches an output signal of the transmission device.

The thermal code output unit can include a high-temperature determination signal transmission unit which transmits a high-temperature determination signal in response to a second enable signal and the level signal; and a first buffer which buffers the output thermal code in response to the select signal.

The high-temperature determination signal transmission unit can include a logic module which receives the second enable signal and a buffering signal of the level signal and performs a logical operation with respect to the second enable signal and the buffering signal of the level signal, and a second buffer which buffers the high-temperature determination signal and outputs the high-temperature determination signal in response to an output signal of the logic module.

The thermal code transmission circuit can further include a latch connected between an output terminal of the first and second buffers and an output pad.

The output pad is formed in an area identical to an area of a thermal sensor which generates the thermal code.

In another embodiment, a semiconductor memory device includes a thermal sensor which generates a plurality of thermal codes and a high-temperature determination signal, a thermal code transmission circuit which receives the thermal codes and the high-temperature determination signal and selectively outputs one of the thermal codes or the high-temperature determination signal, and an output pad which receives and outputs an output signal of the thermal code transmission circuit.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Hereinafter, examples and embodiments of the present disclosure will be described with reference to accompanying drawings. However, the examples and embodiments are for illustrative purposes only and are not intended to limit the scope of the invention.

Figure 2:
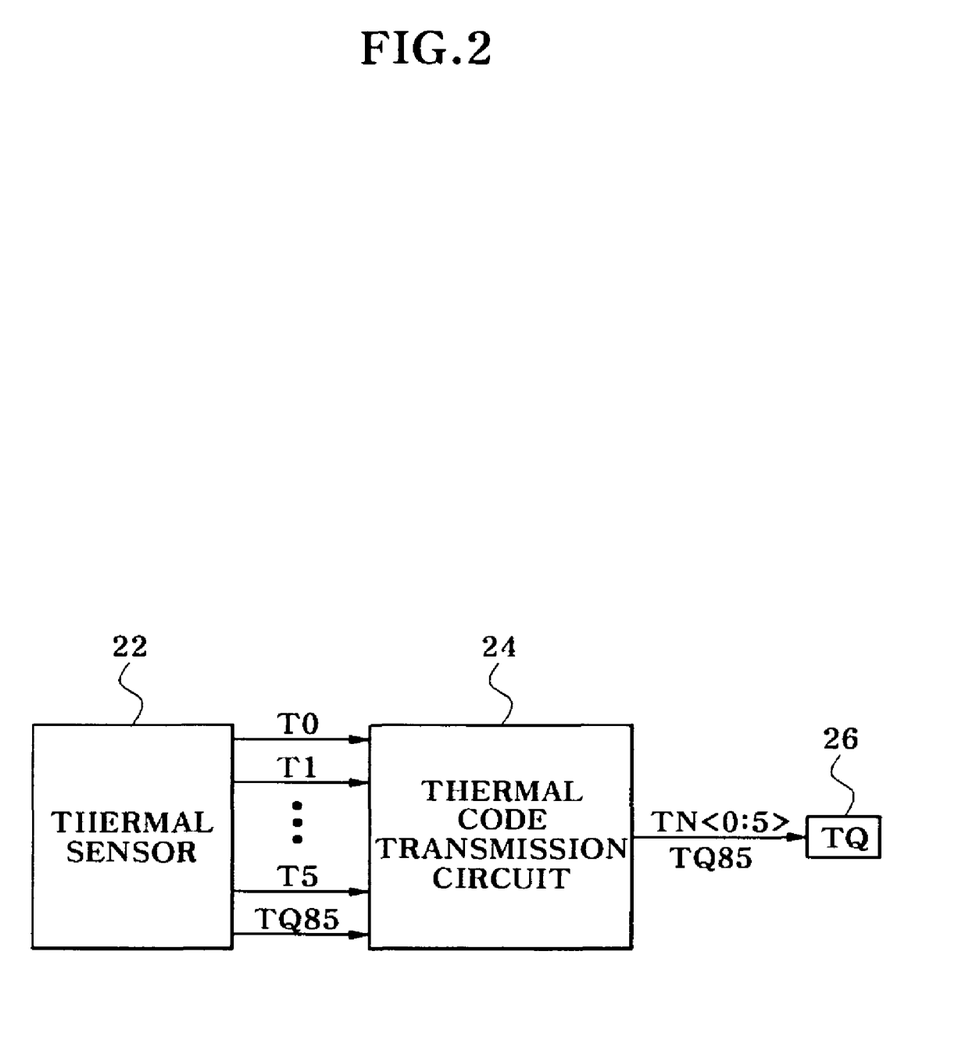
FIG. 2 is a block diagram showing an example of a structure of a semiconductor memory device according to an embodiment of the present disclosure.
Figure 3:
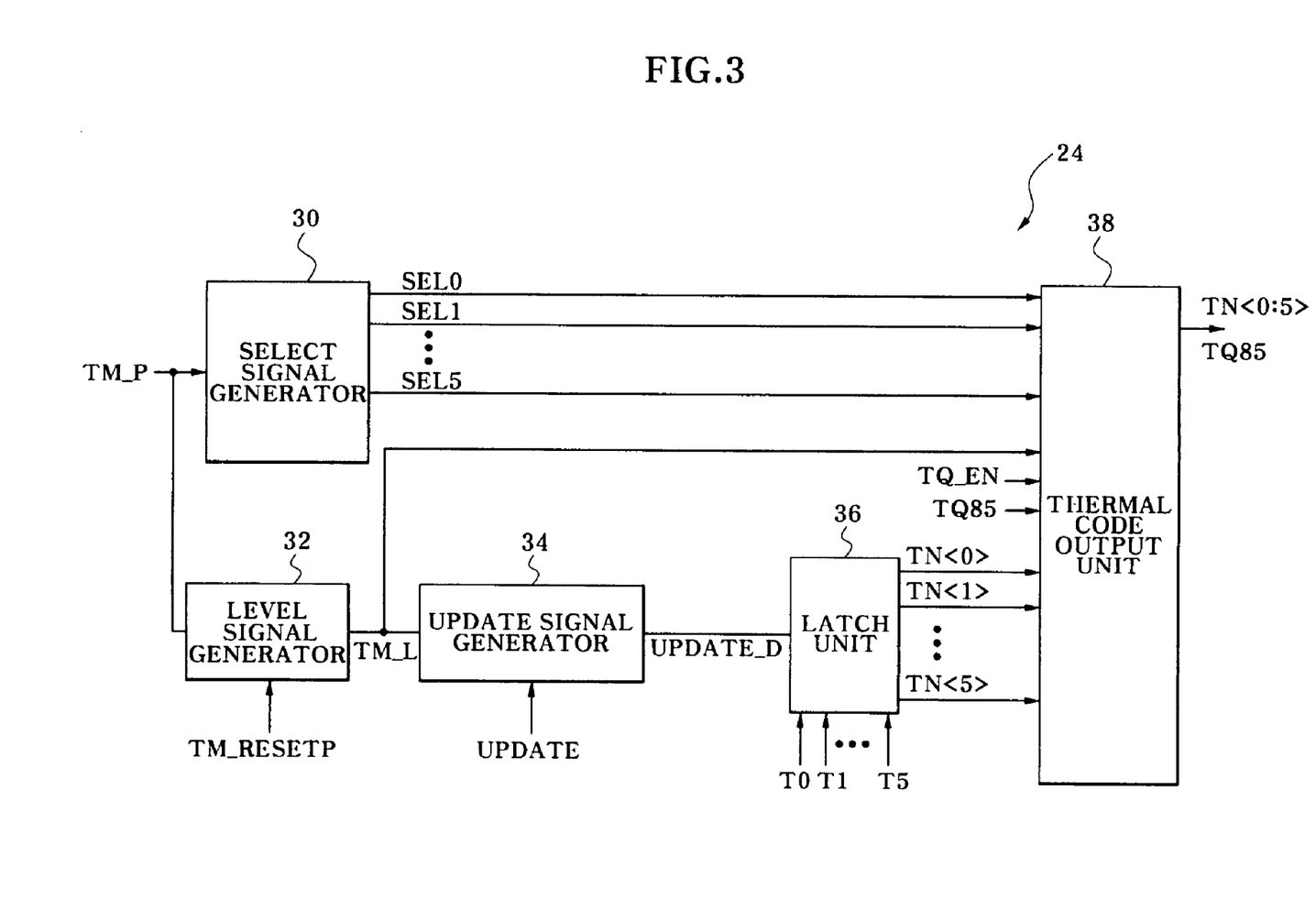
FIG. 3 is a block diagram illustrating an example of a structure of a thermal code transmission circuit shown in FIG. 2.
Figure 4:
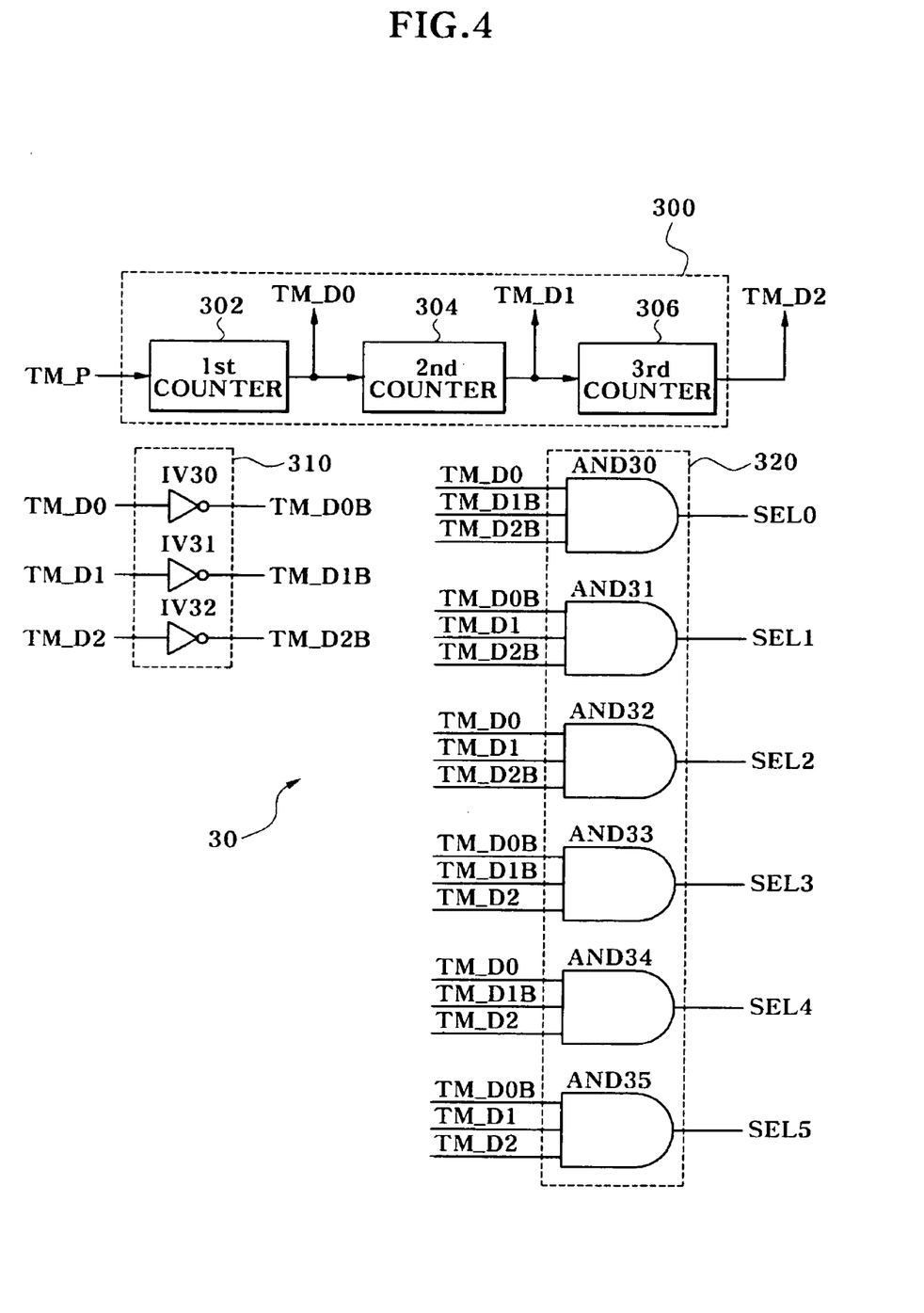
FIG. 4 is a circuit diagram illustrating an example of a structure of a select signal generator shown in FIG. 3.
Figure 5:
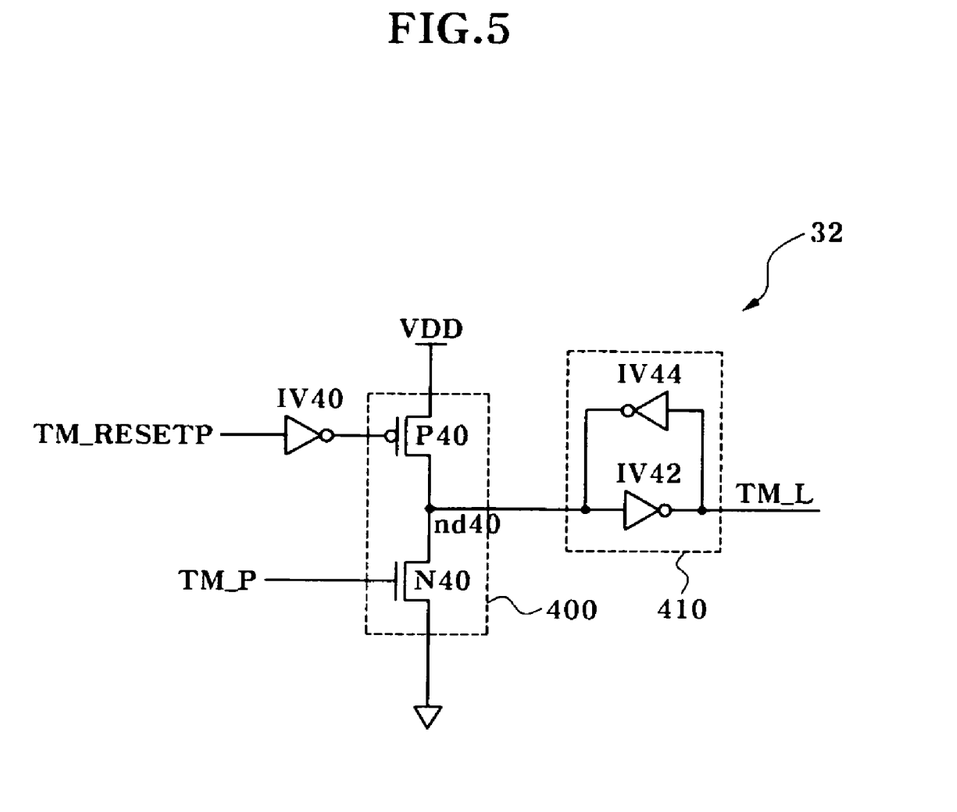
FIG. 5 is a circuit diagram illustrating an example of a structure of a level signal generator shown in FIG. 3.
Figure 6:
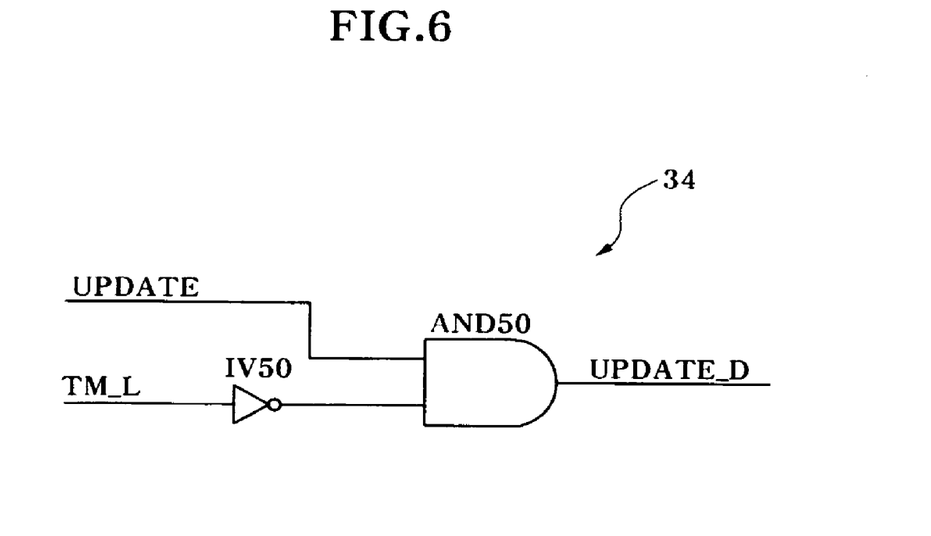
FIG. 6 is a circuit diagram illustrating an example of a structure of an update signal generator shown in FIG. 3.
Figure 7:
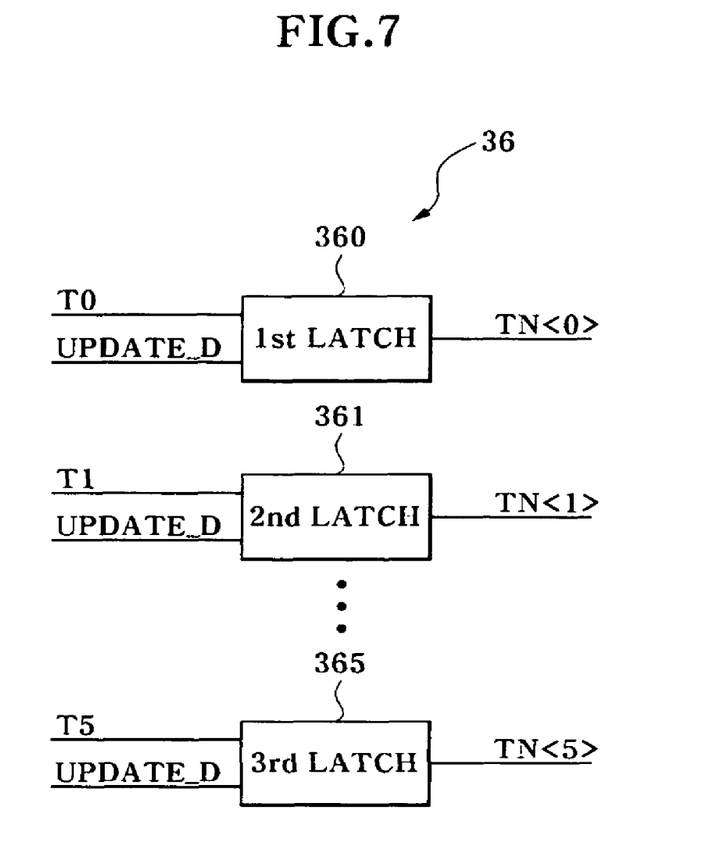
FIG. 7 is a block diagram illustrating an example of a structure of a latch unit shown in FIG. 3.
Figure 8:
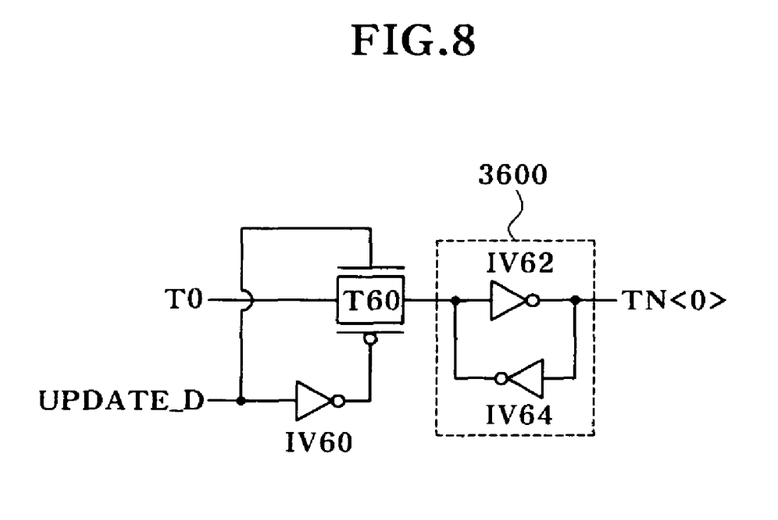
FIG. 8 is a circuit diagram illustrating an example of a first latch shown in FIG. 7.
Figure 9:
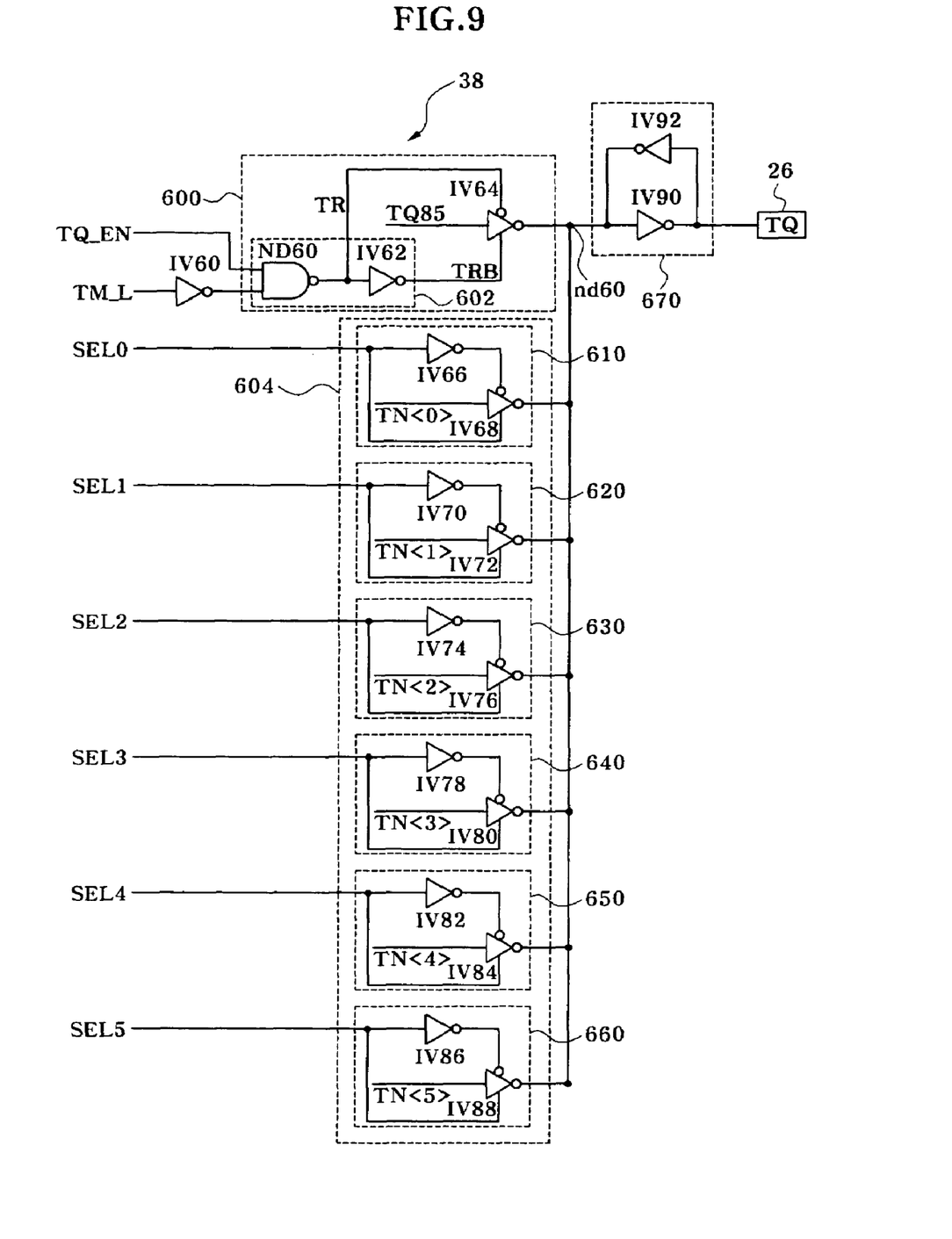
FIG. 9 is a circuit diagram illustrating an example of a thermal code output unit shown in FIG. 3.

FIG. 2 is a block diagram showing the structure of a semiconductor memory device according to an embodiment of the present disclosure, and FIG. 3 is a block diagram illustrating an example of a structure of a thermal code transmission circuit 24 shown in FIG. 2. FIG. 4 is a circuit diagram illustrating an example of a structure of a select signal generator 30 shown in FIG. 3, and FIG. 5 is a circuit diagram illustrating an example of a structure of a level signal generator 32 shown in FIG. 3. FIG. 6 is a circuit diagram illustrating an example of a structure of an update signal generator 34 shown in FIG. 3, and FIG. 7 is a block diagram illustrating an example of a structure of a latch unit 36 shown in FIG. 3. FIG. 8 is a circuit diagram illustrating an example of a structure of a first latch shown in FIG. 7, and FIG. 9 is a circuit diagram illustrating an example of a structure of a thermal code output unit 38 shown in FIG. 3.

As shown in FIG. 2, the semiconductor memory device according to the present embodiment includes a thermal sensor 22, the thermal code transmission circuit 24, and a TQ pad 26.

The thermal sensor 22 generates first to sixth thermal codes T0 to T5 and a high-temperature determination signal TQ85. The thermal sensor 22 generates the first to sixth thermal codes T0 to T5 by converting analog thermal signals, which have been generated using a bandgap reference circuit or a widlar circuit, into digital thermal signals through an analog to digital converter (AD converter). The high-temperature determination signal TQ85 is used to determine if the internal temperature of a semiconductor memory chip is 85□ or more, and may be generated based on the thermal signals.

The thermal code transmission circuit 24 includes the select signal generator 30, the level signal generator 32, the update signal generator 34, the latch unit 36, and the thermal code output unit 38.

The select signal generator 30 generates first to sixth select signals SEL0 to SEL5 in response to a first enable signal TM_P enabled in order to output the first to sixth thermal codes T0 to T5. The first enable signal TM_P is a pulse signal. In more detail, as shown in the example of FIG. 4, the select signal generator 30 includes a counter unit 300, which receives the first enable signal TM_P and performs a counting operation to generate first to third counter signals TM_DO to TM_D2, and a decoder 320, which decodes the first to third counter signals TM_DO to TM_D2 to generate the first to the sixth select signals SEL0 to SEL5. The counter unit 300 generates the first to third counter signals TM_DO to TM_D2, which are up-counted in this manner: '001, 010, 011, 100, 101, and 110', whenever the pulse of the first enable signal TM_P is input. The decoder 320 receives the first to third counter signals TM_DO to TM_D2 to sequentially enable one of the first to sixth select signals SEL0 to SEL5. The counter unit 300 and the decoder 320 may be realized by using a typical counter circuit and a decoder circuit. In this case, when the first enable signal TM_P is enabled, the first enable signal TM_P is input as the pulse signal.

The level signal generator 32 receives the first enable signal TM_P to generate a level signal TM_L. In more detail, as shown in the example of FIG. 5, the level signal generator 32 includes an NMOS transistor N40, which is connected between a node nd40 and a grounding voltage and pull-down driven in response to the first enable signal TM_P, a PMOS transistor P40, which is connected to a power supply voltage VDD and the node nd40 and pull-up driven in response to an inverse signal of a reset signal TM_RESETP, and a latch 410, which latches the signal of the node nd40 to output the level signal TM_L.

As shown in the example of FIG. 6, the update signal generator 34 includes an AND gate AND50 that receives a first update signal Update and an inverse signal of the level signal TM_L and performs an AND operation with respect to the first update signal Update and the inverse signal of the level signal TM_L to generate a second update signal Update_d. The first update signal Update is enabled (activated) at a predetermined periodic interval, for example, every 256 ms, and the second update signal Update_d is disabled (deactivated) when the level signal TM_L is enabled.

As shown in the example of FIG. 7, the latch unit 36 includes first to sixth latches 360 to 365. The first latch 360 receives the first thermal code T0 in response to the second update signal Update_d, latches the first thermal code T0, and then outputs a first output thermal code TN<0>. The second latch 361 receives the second thermal code T1 in response to the second update signal Update_d, latches the second thermal code T1, and then outputs a second output thermal code TN<1>. The third latch 362 receives the third thermal code T2 in response to the second update signal Update_d, latches the third thermal code T2, and then outputs a third output thermal code TN<2>. The fourth latch 363 receives the fourth thermal code T3 in response to the second update signal Update_d, latches the fourth thermal code T3, and then outputs a fourth output thermal code TN<3>. The fifth latch 364 receives the fifth thermal code T4 in response to the second update signal Update-d, latches the fifth thermal code T4, and then outputs a fifth output thermal code TN<4>. The sixth latch 365 receives the sixth thermal code T5 in response to the second update signal Update_d, latches the sixth thermal code T5, and then outputs a sixth output thermal code TN<5>.

In more detail, referring to the example of FIG. 8, the first latch 360 includes a transmission gate T60, which is turned on in response to the second update signal Update_d, and a latch 3600 including inverters IV62 and IV64. The second to sixth latches 361 to 365 have the same circuit structure as that of the first latch 360, and details thereof will be omitted.

The thermal code output unit 38 includes a high-temperature determination signal transmission unit 600, which transmits the high-temperature determination signal TQ85 to the node nd60 in response to the level signal TM_L and the second enable signal TQ_EN enabled in order to output the high-temperature determination signal TQ85, a buffer unit 604, which buffers the first to sixth output thermal codes TN<0:5> and outputs the first to sixth output thermal codes TN<0:5> to the node nd60 in response to the first to sixth select signals SEL0 to SEL5, and a latch unit 670, which latches the signal of the node nd60 and transmits the signal of the node nd60 to the TQ pad 26.

The high-temperature determination signal transmission unit 600 includes a NAND gate ND60, which receives the second enable signal TQ_EN and the inverse signal of the level signal TM_L and performs a NAND operation with respect to the second enable signal TQ_EN and the inverse signal of the level signal TM_L to generate a signal TR, an inverter IV62, which inverts the output signal of the NAND gate ND60 to generate an inverse signal TRB, and an inverter IV64, which buffers the high-temperature determination signal TQ85 and outputs the high-temperature determination signal TQ85 to the node nd60 in response to the signal TR and the inverse signal TRB.

The buffer unit 604 includes first to sixth buffers 610 to 660. The first buffer 610 buffers the first output thermal code TN<0> and outputs the first output thermal code TN<0> to the node nd60 in response to the first select signal SEL0. The second buffer 620 buffers the second output thermal code TN<1> and outputs the second output thermal code TN<1> to the node nd60 in response to the second select signal SEL1. The third buffer 630 buffers the third output thermal code TN<2> and outputs the third output thermal code TN<2> to the node nd60 in response to the third select signal SEL2. The fourth buffer 640 buffers the fourth output thermal code TN<3> and outputs the fourth output thermal code TN<3> to the node nd60 in response to the fourth select signal SEL3. The fifth buffer 650 buffers the fifth output thermal code TN<4> and outputs the fifth output thermal code TN<4> to the node nd60 in response to the fifth select signal SEL4. The sixth buffer 660 buffers the sixth output thermal code TN<5> and outputs the sixth output thermal code TN<5> to the node nd60 in response to the sixth select signal SEL5.

Hereinafter, the operation of the semiconductor memory device having the above structure will be described.

The thermal sensor 22 shown in the example of FIG. 3 generates the high-temperature determination signal TQ85 and the first to sixth thermal codes T0 to T5 by converting analog thermal signals, which have been generated using a bandgap reference circuit is or a widlar circuit, into digital thermal signals through an analog to digital converter (AD converter).

Then, the thermal code transmission circuit 24 receives the first to sixth thermal codes T0 to T5 and the high-temperature determination signal TQ85 and outputs the first to sixth thermal codes T0 to T5 and the high-temperature determination signal TQ85 through the TQ pad 26. The thermal code transmission circuit 24 according to the present embodiment receives and latches the first to sixth thermal codes T0 to T5 to generate the first to sixth output thermal codes TN<0:5> and selectively outputs the first to sixth output thermal codes TN<0:5> through the TQ pad 25 according to the first to sixth select signals SEL0 to SEL5. Since the thermal code transmission circuit 24 according to the present embodiment outputs the first to sixth output thermal codes TN<0:5>, which are generated in an input pad unit, through the TQ pad 26 placed in the input pad unit, it is unnecessary to install a global metal line used to transmit the first to sixth output thermal codes TN<0:5> to a DQ pad. Accordingly, a mobile DRAM chip including the semiconductor memory device according to the present embodiment and an output driver which outputs the first to sixth output thermal codes TN<0:5> can be realized with a small size. Hereinafter, the operation of the thermal code transmission circuit 24 will be described in more detail.

First, the select signal generator 30 shown in the example of FIG. 4 generates the first to sixth select signals SEL0 to SEL5 in response to the first enable signal TM_P enabled in order to output the first to sixth thermal codes T0 to T5. At this time, the counter unit 300 generates the first to third counter signals TM_D0 to TM_D2, which are up-counted as '001, 010, 011, 100, 101, 110', whenever the pulse of the first enable signal TM_P is input. Accordingly, the first to sixth select signals SEL0 to SEL5 output from the decoder 320 are sequentially enabled at a high level as shown in following table 1. For example, when three pulses of the first enable signal TM_P are input, the first to third counter signals TM_D0 to TM_D2 are generated in a high level, a high level, and a low level, respectively. Accordingly, only the third select signal SEL3 among the first to sixth select signal SEL0 to SEL5 is enabled at a high level.

TABLE 1

| TM_P | TM_D2 | TM_D1 | TM_D0 | SEL0 | SEL1 | SEL2 | SEL3 | SEL4 | SEL5 |
|---|---|---|---|---|---|---|---|---|---|
| 1 | L | L | H | H | L | L | L | L | L |
| 2 | L | H | L | L | H | L | L | L | L |
| 3 | L | H | H | L | L | H | L | L | L |
| 4 | H | L | L | L | L | L | H | L | L |
| 5 | H | L | H | L | L | L | L | H | L |
| 6 | H | H | L | L | L | L | L | L | H |

Next, the level signal generator 32 shown in the example of FIG. 5 receives the first enable signal TM_P to generate the level signal TM_L. When the output of the first to sixth output thermal codes TN<0:5> is necessary, the pulse of the first enable signal TM_P is input so that the NMOS transistor N40 is turned on. Accordingly, the node nd40 is pull-down driven to a low level, and the level signal TM_L becomes a high level. Then, even if the pulse of the first enable signal TM_P is not enabled, the level signal TM_L is maintained at a high level by the latch 410. After the output thermal codes TN<0:5> have been output, the reset signal TM_RESETP becomes a high level so that the PMOS transistor P40 is turned on.

Accordingly, the node nd40 is pull-up driven to a high level, and the level signal TM_L becomes to a low level.

Thereafter, the update signal generator 34 shown in the is example of FIG. 6 receives the first update signal Update and the level signal TM_L to generate the second update signal Update_d. When the first enable signal TM_P is enabled so that the level signal TM_L having a high level is input, the update signal generator 34 generates the second update signal Update_d disabled at a low level regardless of the first enable signal TM_P. Although the first update signal Update is enabled at a high level every 256 ms such that the first to sixth output thermal codes TN<0:5> are updated according to the first to sixth thermal codes T0 to T5, the second update signal Update_d generated from the update signal generator 34 maintains the first to sixth output thermal codes TN<0:5> in the previous levels thereof during a section in which the level signal TM_L having a high level is input.

Subsequently, the latch unit 36 shown in the example of FIG. 7 updates the first to sixth output thermal codes TN<0: 5> based on the first to sixth thermal codes T0 to T5 in response to the second update signal Update_d. The first to sixth output thermal codes TN<0:5> are not updated, but maintain the levels thereof when the second update signal Update_d is generated at a low level due to the enabling of the first enable signal TM_P. For example, since the transmission gate T60 is turned off in the first latch 360 by the second update signal Update_d having the low level, a signal latched by the latch unit 3600 is output as the first output thermal code TN<0>. Since the second to sixth latches 361 to 365 have the same circuit structure as that of the first latch 360, signals obtained by latching the second to sixth thermal codes T1 to T5, which are previously input, are output as the second to sixth output thermal codes TN<1:5 >.

The thermal code output unit 38 shown in the example of FIG. 9 outputs the high-temperature determination signal TQ85 or selectively outputs the first to the sixth output thermal codes TN<0:5> in response to the second enable signal TQ_EN and the level signal TM_L. In the case in which the high-temperature determination signal TQ85 is output through the TQ pad 26, the second enable signal TQ_EN is enabled at a high level, and the level signal TM_L is disabled at a low level. Accordingly, since the signal TR output from the NAND gate ND60 and the inverse signal TRB output from the inverter IV62 are a low level and a high level, respectively, the high-temperature determination signal TQ85 is output to the TQ pad 26 through the inverter IV64 and the latch 670. At this time, since the first enable signal TM_P is disabled, the first enable signal TM_P is not input as a pulse signal. Accordingly, all of the first to sixth select signals SEL0 to SEL5 become a low level, so that the first to sixth output thermal codes TN<0:5> are not delivered to the node nd60.

Meanwhile, in the case in which the first to sixth output thermal codes TN<0:5> are selectively output through the TQ pad 26, the second enable signal TQ-EN is disabled at a low level, and the level signal TM_L is enabled at a high level. Accordingly, the inverter IV64 does not deliver the high-temperature determination signal TQ85 to the node nd60. At this time, since one of the first to sixth select signals SEL0 to SEL5 is selectively enabled at a high level according to the number of pulses of the first enable signal TM_P which has been enabled, one of the first to sixth output thermal codes TN<0:5> is selectively delivered to the node nd60 through one of the first to sixth buffers 610 to 660 and then output to the TQ pad 26 through the latch 670.

As described above, the semiconductor memory device according to the present embodiment includes the thermal code transmission circuit 24 to select the high-temperature determination signal TQ85, or one of the first to sixth output thermal codes TN<0:5>, which have been generated from the thermal sensor 22, and output the selected signal through the TQ pad 26. Accordingly, in contrast to a conventional technology, it is unnecessary to install a global metal line 20 in a peri-area 2 in order to output the first to sixth output thermal codes TN<0:5> through a DQ pad 30. Therefore, the size of a chip and an output driver can be reduced. In addition, power consumption for the transmission of the first to sixth output thermal codes TN<0:5> can be reduced.

Although examples and embodiments of the present invention have been described for illustrative purposes, those skilled in the art will appreciate that various modifications, additions and substitutions are possible, without departing from the scope and spirit of the invention as disclosed in the accompanying claims.

The present disclosure claims priority to Korean application 10-2007-0141035, filed on Dec. 28, 2007, the entire contents of which are incorporated herein by reference.

What is claimed is:

1. A thermal code transmission circuit comprising:
   a select signal generator configured to generate a select signal in response to a first enable signal;
   a level signal generator configured to receive the first enable signal and generate a level signal;
   an update signal generator configured to receive the level signal and a first update signal and generate a second update signal;
   a latch unit configured to receive a thermal code in response to the second update signal and output the thermal code as an output thermal code; and
   a thermal code output unit configured to selectively output the output thermal code in response to the select signal.

2. The thermal code transmission circuit of claim 1, wherein the first enable signal is a pulse signal used to output the output thermal code.

3. The thermal code transmission circuit of claim 2, wherein the select signal generator includes:
   a counter unit configured to receive the first enable signal and perform a counting operation to generate a counter signal; and
   a decoder configured to decode the counter signal to generate the select signal.

4. The thermal code transmission circuit of claim 2, wherein the level signal generator includes:
   a pull-down device configured to pull-down drive a predetermined node in response to the first enable signal;
   a pull-up device configured to pull-up drive the node in response to a reset signal; and
   a latch configured to latch a signal of the node.

5. The thermal code transmission circuit of claim 4, wherein the pull-down device is an NMOS transistor, and the pull-up device is a PMOS transistor.

6. The thermal code transmission circuit of claim 1, wherein the update signal generator includes a logic device configured to receive the first update signal and the level signal and perform a logical operation with respect to the first update signal and the level signal.

7. The thermal code transmission circuit of claim 6, wherein the logic device generates the second update signal which is disabled in response to enable of the level signal.

8. The thermal code transmission circuit of claim 1, wherein the latch unit includes:
   a transmission device configured to transmit the thermal code in response to the second update signal; and
   a latch configured to latch an output signal of the transmission device.

9. The thermal code transmission circuit of claim 1, wherein the thermal code output unit includes:
   a high-temperature determination signal transmission unit configured to transmit a high-temperature determination signal in response to a second enable signal and the level signal; and
   a first buffer configured to buffer the output thermal code in response to the select signal.

10. The thermal code transmission circuit of claim 9, wherein the high-temperature determination signal transmission unit includes:
   a logic module configured to receive the second enable signal and a buffering signal of the level signal and perform a logical operation with respect to the second enable signal and the buffering signal of the level signal; and
   a second buffer configured to buffer the high-temperature determination signal and outputs the high-temperature determination signal in response to an output signal of the logic module.

11. The thermal code transmission circuit of claim 10, further includes a latch connected between an output terminal of the first and second buffers and an output pad.

12. The thermal code transmission circuit of claim 11, wherein the output pad is formed in an area identical to an area of a thermal sensor which generates the thermal code.

13. A semiconductor memory device comprising:
   a thermal sensor configured to generate a plurality of thermal codes and a high-temperature determination signal;
   a thermal code transmission circuit configured to receive the thermal codes and the high-temperature determination signal and selectively output one of the thermal codes or the high-temperature determination signal; and
   an output pad configured to output selectively any one of the thermal code and the high-temperature determination signal received from the thermal code transmission circuit,
   wherein the output pad is formed in an area identical to an area of the thermal sensor which generates the thermal code.

14. The semiconductor memory device of claim 13, wherein the thermal code transmission circuit includes:
   a select signal generator configured to generate a select signal in response to a first enable signal;
   a level signal generator configured to receive the first enable signal and generate a level signal;
   an update signal generator configured to receive the level signal and a first update signal and generate a second update signal;
   a latch unit configured to receive the thermal codes in response to the second update signal and output the thermal codes as a plurality of output thermal codes;
   a high-temperature determination signal transmission unit configured to transmit a high-temperature determination signal in response to a second enable signal and the level signal; and
   a buffer unit configured to selectively buffer the output thermal codes in response to the select signal.

15. The semiconductor memory device of claim 14, wherein the first enable signal is a pulse signal used to output the output thermal code.

16. The semiconductor memory device of claim 15, wherein the select signal generator includes:
   a counter unit configured to perform a counting operation through input of the first enable signal and generate a counter signal; and
   a decoder configured to decode the counter signal and generate the select signal.

17. The semiconductor memory device of claim 15, wherein the level signal generator includes:
   a pull-down device configured to pull-down drive a predetermined node in response to the first enable signal;
   a pull-up device configured to pull-up drive the node in response to a reset signal; and
   a latch configured to latch a signal of the node.

18. The semiconductor memory device of claim 17, wherein the pull-down device is an NMOS transistor, and the pull-up device is a PMOS transistor.

19. The semiconductor memory device of claim 14, wherein the update signal generator includes a logic device configured to receive the first update signal and the level signal and perform a logical operation.

20. The semiconductor memory device of claim 19, wherein the logic device generates the second update signal which is disabled in response to enabling of the level signal.

21. The semiconductor memory device of claim 14, wherein the latch unit includes:
   a transmission device configured to transmit the thermal code in response to the second update signal; and
   a latch configured to latch an output signal of the transmission device.

22. The semiconductor memory device of claim 14, wherein the high-temperature determination signal transmission unit includes:
   a logic module configured to receive the second enable signal and a buffering signal of the level signal and perform a logical operation with respect to the second enable signal and the buffering signal of the level signal; and
   a second buffer configured to buffer the high-temperature determination signal and output the high-temperature determination signal in response to an output signal of the logic module.

23. The semiconductor memory device of claim 22, further includes a latch connected between an output terminal of the first and second buffers and an output pad.

* * * * *